(12) United States Patent
Jin et al.

(10) Patent No.: US 11,395,409 B2
(45) Date of Patent: *Jul. 19, 2022

(54) VOLTAGE REGULATOR MODULE

(71) Applicant: Delta Electronics, Inc., Taoyuan (TW)

(72) Inventors: Da Jin, Taoyuan (TW); Yahong Xiong, Taoyuan (TW); Junguo Cui, Taoyuan (TW); Qinghua Su, Taoyuan (TW)

(73) Assignee: DELTA ELECTRONICS, INC, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/170,537

(22) Filed: Feb. 8, 2021

(65) Prior Publication Data

US 2021/0161015 A1 May 27, 2021

Related U.S. Application Data

(63) Continuation of application No. 16/887,026, filed on May 29, 2020, now Pat. No. 11,134,571.

(30) Foreign Application Priority Data

| Jun. 4, 2019 | (CN) | .......................... | 201910481366.8 |
| Feb. 28, 2020 | (CN) | .......................... | 202010127444.7 |
| Mar. 25, 2020 | (CN) | .......................... | 202010217191.2 |

(51) Int. Cl.
| H05K 7/10 | (2006.01) |
| H05K 1/18 | (2006.01) |
| H02M 3/04 | (2006.01) |
| H05K 1/11 | (2006.01) |
| H05K 1/14 | (2006.01) |
| H01F 27/24 | (2006.01) |

(Continued)

(52) U.S. Cl.
CPC ............. *H05K 1/181* (2013.01); *H01F 27/24* (2013.01); *H01F 27/28* (2013.01); *H02M 3/04* (2013.01);

(Continued)

(58) Field of Classification Search
CPC ........ H05K 1/181; H05K 1/111; H05K 1/144; H01F 27/24; H01F 27/28; H02M 3/04; H02M 3/158; H02M 3/1584

(Continued)

(56) References Cited

U.S. PATENT DOCUMENTS

| 5,353,001 A | 10/1994 | Meinel et al. |
| 9,641,095 B1 | 5/2017 | Wild et al. |

(Continued)

FOREIGN PATENT DOCUMENTS

| CN | 102369790 A | 3/2012 |
| CN | 102686025 A | 9/2012 |

(Continued)

*Primary Examiner* — Andargie M Aychillhum
(74) *Attorney, Agent, or Firm* — Kirton McConkie; Evan R. Witt

(57) ABSTRACT

A voltage regulator module includes a circuit board, a metallic winding assembly, a switching circuit and a magnetic core assembly. The circuit board includes an accommodation space, a first surface and a second surface. The accommodation space is formed within the circuit board and in communication with a first opening and a second opening. The metallic winding assembly includes third opening. A projection region of the switching circuit and a projection region of the metallic winding assembly on the first surface are partially overlapped with each other. The magnetic core assembly includes an upper core, a lower core and a lateral leg. The upper core and the lower core are disposed on the circuit board. The lateral leg is penetrated through the first opening, the third opening and the second opening. An inductor is defined by the magnetic core assembly and the metallic winding assembly collaboratively.

23 Claims, 18 Drawing Sheets

(51) Int. Cl.
*H01F 27/28* (2006.01)
*H02M 3/28* (2006.01)
*H02M 7/00* (2006.01)
*H02M 7/217* (2006.01)
*H02M 3/158* (2006.01)

(52) U.S. Cl.
CPC ......... *H02M 3/158* (2013.01); *H02M 3/1584* (2013.01); *H02M 3/28* (2013.01); *H02M 7/003* (2013.01); *H02M 7/217* (2013.01); *H05K 1/111* (2013.01); *H05K 1/115* (2013.01); *H05K 1/144* (2013.01); *H05K 1/182* (2013.01); *H05K 2201/1003* (2013.01); *H05K 2201/10015* (2013.01)

(58) Field of Classification Search
USPC .......................................................... 361/767
See application file for complete search history.

(56) References Cited

U.S. PATENT DOCUMENTS

| | | |
|---|---|---|
| 2011/0032683 A1 | 2/2011 | Li et al. |
| 2011/0116292 A1 | 5/2011 | Tsai et al. |
| 2015/0282370 A1 | 10/2015 | Yang et al. |
| 2016/0268034 A1 | 9/2016 | Subat et al. |
| 2018/0310408 A1 | 10/2018 | Hamada et al. |

FOREIGN PATENT DOCUMENTS

| | | |
|---|---|---|
| CN | 103219332 A | 7/2013 |
| CN | 104272883 A | 1/2015 |
| CN | 107437885 A | 12/2017 |
| CN | 108022917 A | 5/2018 |
| CN | 107437885 B | 2/2020 |
| KR | 20010114120 A | 12/2001 |
| WO | 2012149740 A1 | 11/2012 |

VOLTAGE REGULATOR MODULE

CROSS-REFERENCE TO RELATED APPLICATION

This application is a Continuation Application of U.S. patent application Ser. No. 16/887,026 filed on May 29, 2020 and entitled "VOLTAGE REGULATOR MODULE", which claims priority to China patent application No. 201910481366.8 filed on Jun. 4, 2019, claims priority to China patent application No. 202010127444.7 filed on Feb. 28, 2020, and claims priority to China patent application No. 202010217191.2 filed on Mar. 25, 2020. The entireties of the above-mentioned patent applications are incorporated herein by reference for all purposes.

FIELD OF THE INVENTION

The present disclosure relates to a voltage regulator module, and more particularly to a voltage regulator module with reduced thickness.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 has a horizontal layout structure. The electronic device 1 includes a central processing unit (CPU) 11, a voltage regulator module 12 and a system board 13. The voltage regulator module 12 includes an output capacitor 14. The voltage regulator module 12 is used for converting an input voltage into a regulated voltage and providing the regulated voltage to the central processing unit 11. The voltage regulator module 12 and the central processing unit 11 are disposed on a first surface of the system board 13. For meeting the load dynamic switching requirements, the output terminal of the voltage regulator module 12 is located near the input terminal of the central processing unit 11. The output capacitor 14 is disposed on a second surface of the system board 13. The first surface and the second surface of the system board 13 are opposed to each other. The output capacitor 14 is located beside the input terminal of the central processing unit 11.

The voltage regulator module 12 further includes a circuit board 15 and a magnetic element 16. The magnetic element 16 is disposed on the circuit board 15. Moreover, a switch element is disposed in a vacant space between the circuit board 15 and the magnetic element 16. The circuit board 15 is disposed on the first surface of the system board 13. The heat from the voltage regulator module 12 can be transferred to the system board 13 through the circuit board 15. Moreover, the heat is dissipated away through a heat dissipation mechanism (not shown) of the system board 13.

However, according to the requirements, the power density for the system board 13 is gradually increased and the thickness for the system board 13 is gradually decreased. Consequently, the voltage regulator module 12 are developed toward small thickness (e.g., smaller than 5 mm, or smaller than or equal to 3 mm). Since the switch element and the magnetic element 16 are disposed on the circuit board 15 of the electronic device 1 according to the conventional technology, the thickness of the voltage regulator module 12 is still large. Moreover, for meeting the requirements of the multi-phase buck circuit, the circuit board of the conventional voltage regulator module 12 is a multilayered circuit board and a plurality of planar winding assemblies are mounted in the multilayered circuit board. However, the use of the multilayered circuit board increases the thickness of the electronic device 1.

Therefore, there is a need of providing an improved voltage regulator module in order to overcome the drawbacks of the conventional technologies.

SUMMARY OF THE INVENTION

An object of the present disclosure provides a voltage regulator module with reduced thickness.

In accordance with an aspect of the present disclosure, a voltage regulator module is provided. The voltage regulator module includes a first circuit board, at least one metallic winding assembly, at least one switching circuit and a magnetic core assembly. The first circuit board includes at least one accommodation space, a first surface and a second surface. The first surface and the second surface of the first circuit board are opposed to each other. The first surface of the first circuit board includes at least one first opening. The second surface of the first circuit board includes at least one second opening. The at least one accommodation space is formed within the first circuit board and arranged between the first surface and the second surface of the first circuit board. The at least one accommodation space is in communication with the at least one first opening and the at least one second opening. The at least one metallic winding assembly is disposed within the at least one accommodation space and embedded in the first circuit board. The at least one metallic winding assembly includes at least one third opening. The at least one third opening is aligned with the corresponding first opening and the corresponding second opening. The at least one switching circuit is disposed on the first surface of the first circuit board. A projection region of the at least one switching circuit on the first surface of the first circuit board and a projection region of the corresponding metallic winding assembly on the first surface of the first circuit board are partially overlapped with each other. The magnetic core assembly includes an upper core, a lower core and at least one lateral leg. The upper core is disposed on the first circuit board through the first surface of the first circuit board. The lower core is disposed on the first circuit board through the second surface of the first circuit board. The at least one lateral leg is arranged between the upper core and the lower core and penetrated through the corresponding first opening, the corresponding third opening and the corresponding second opening. At least one inductor is defined by the magnetic core assembly and the at least one metallic winding assembly collaboratively. One end of the at least one metallic winding assembly is electrically connected with the at least one switching circuit.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
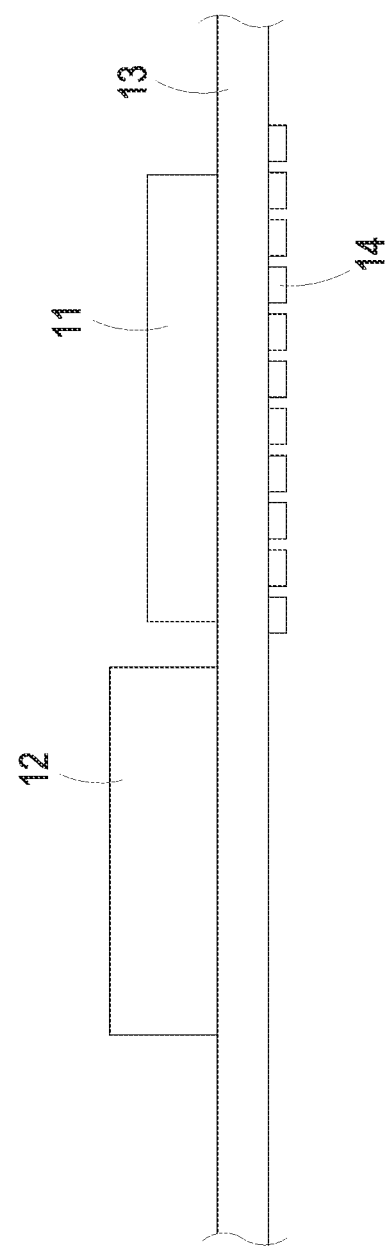
FIG. 1A schematically illustrates the structure of a conventional electronic device.
Figure 1B:
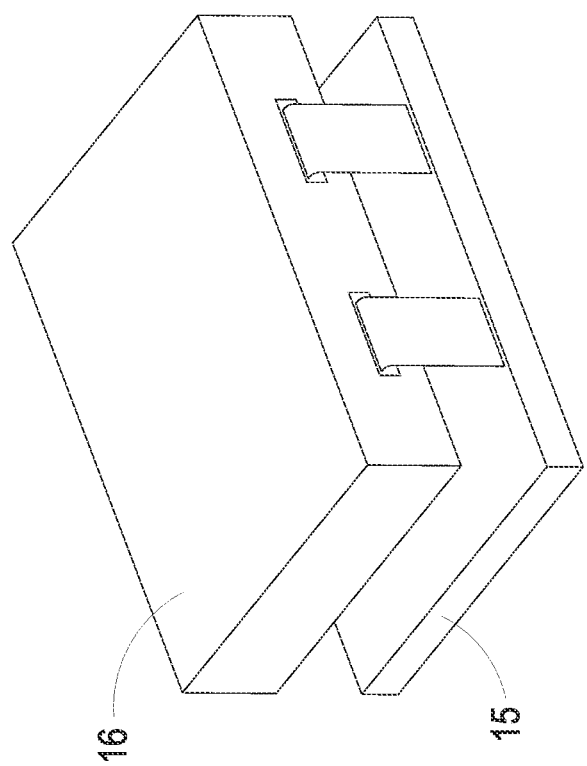
FIG. 1B schematically illustrates the structure of a voltage regulator module of the electronic device as shown in FIG. 1A.
Figure 2:
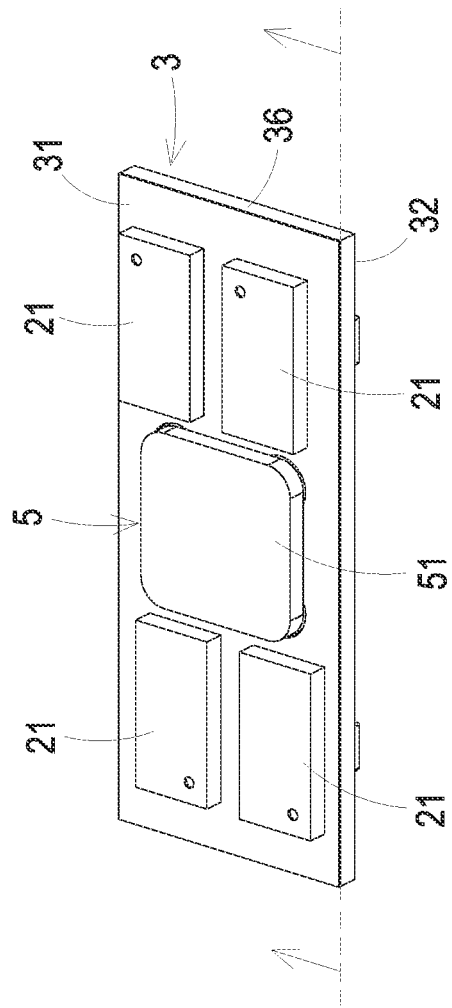
FIG. 2 is a schematic perspective view illustrating the structure of a voltage regulator module according to a first embodiment of the present disclosure.
Figure 3:
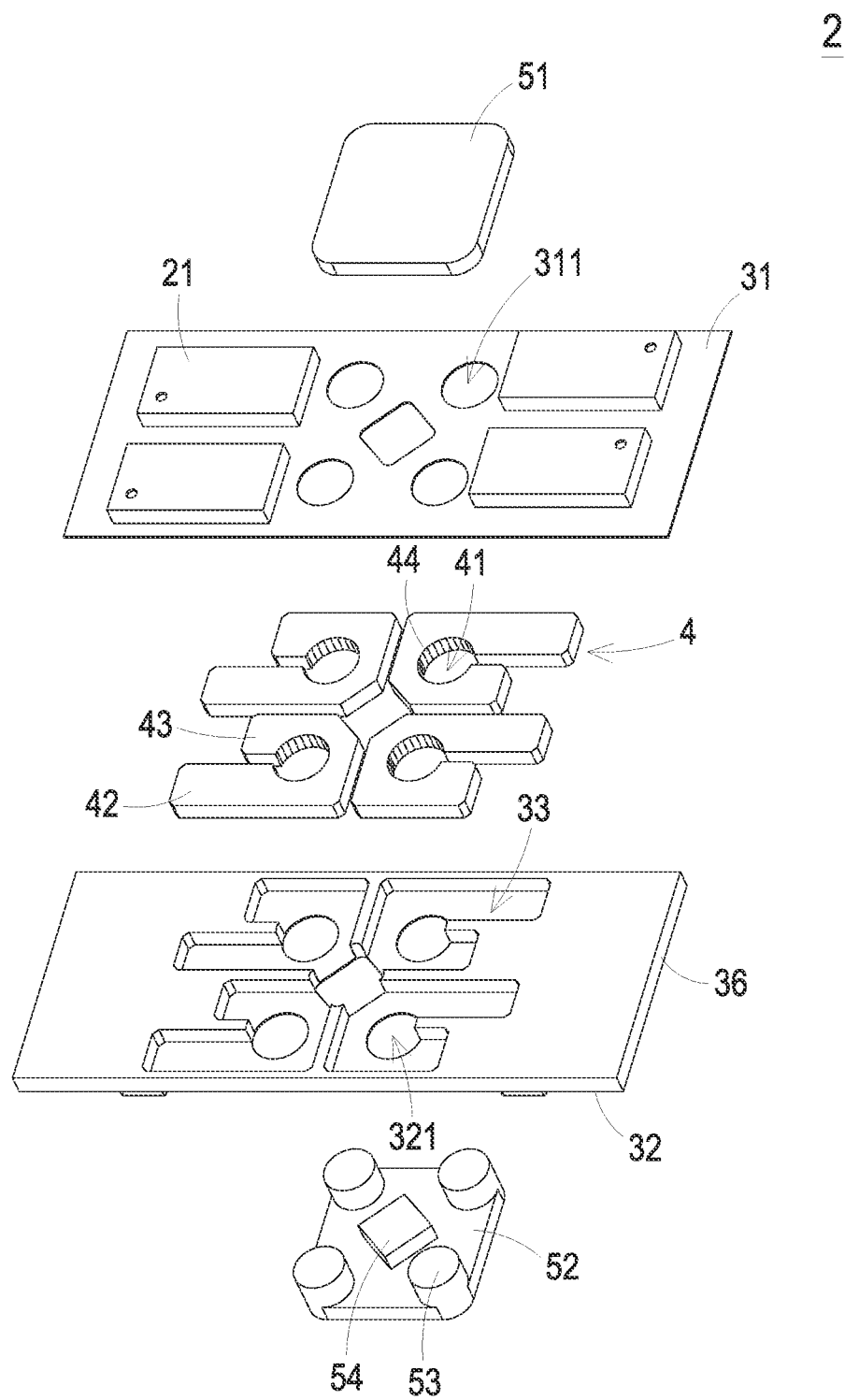
FIG. 3 is a schematic exploded view illustrating the structure of the voltage regulator module as shown in FIG. 2.
Figure 4:
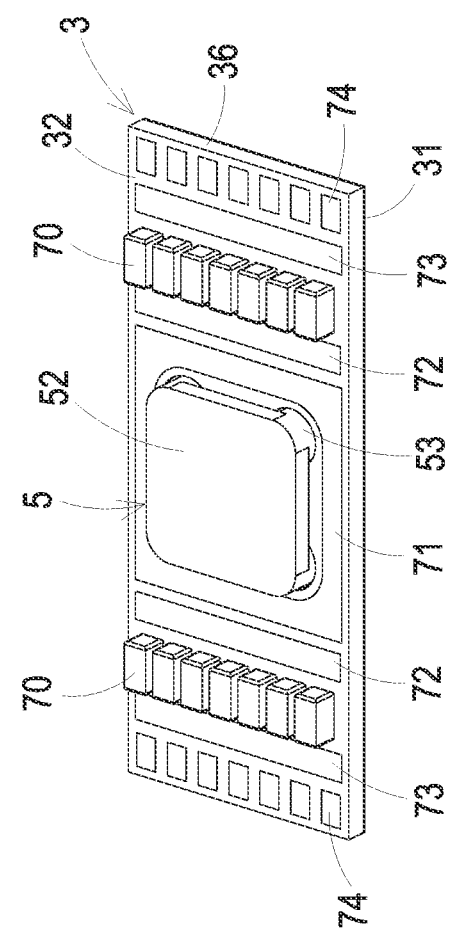
FIG. 4 is a schematic perspective view illustrating the structure of the voltage regulator module and taken along another viewpoint.
Figure 5:
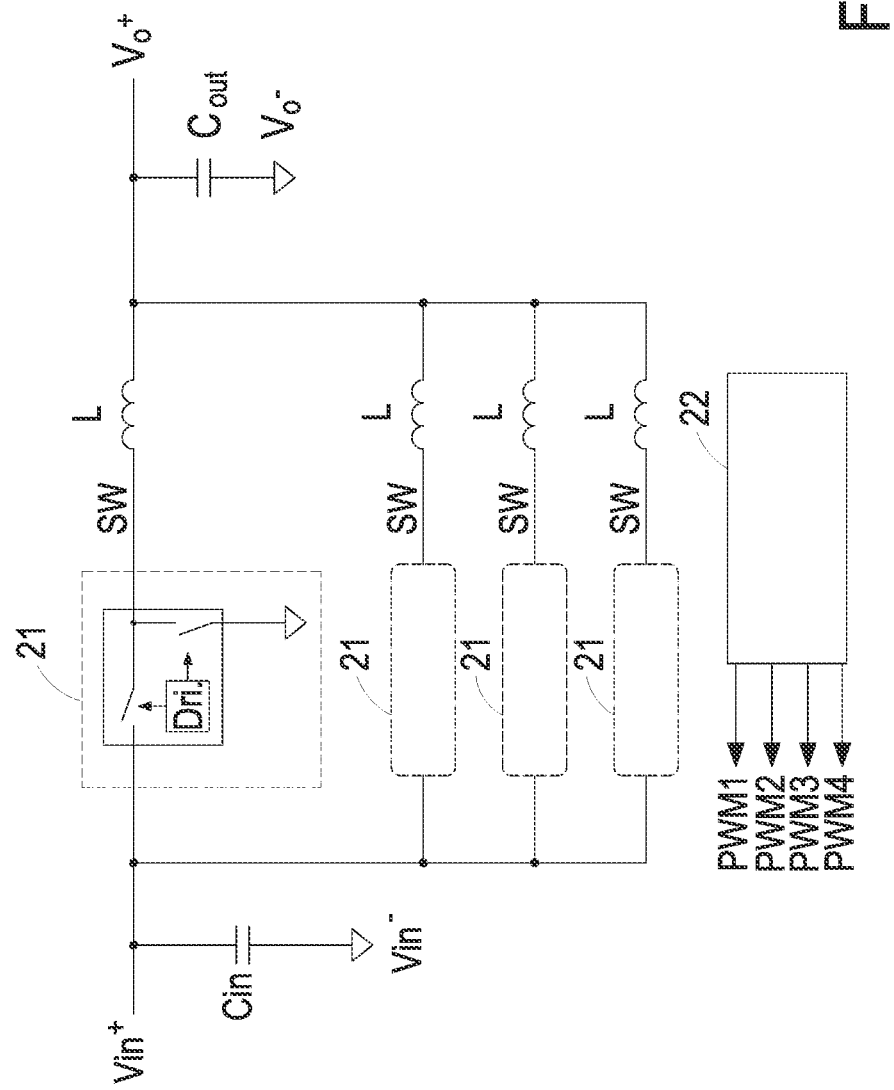
FIG. 5 is a schematic equivalent circuit diagram illustrating the voltage regulator module as shown in FIG. 2.

Please refer to FIGS. 2, 3, 4 and 5. FIG. 2 is a schematic perspective view illustrating the structure of a voltage regulator module according to a first embodiment of the present disclosure. FIG. 3 is a schematic exploded view illustrating the structure of the voltage regulator module as shown in FIG. 2. FIG. 4 is a schematic perspective view illustrating the structure of the voltage regulator module and taken along another viewpoint. FIG. 5 is a schematic equivalent circuit diagram illustrating the voltage regulator module as shown in FIG. 2. The voltage regulator module 2 may be disposed in an electronic device and welded on a system board or a carrier board (not shown) within the electronic device. The voltage regulator module 2 includes at least two single-phase buck circuits, at least one input capacitor Cin and an output capacitor Cout. In some other embodiments, the buck circuits are replaced by boost circuits or buck-boost circuits.

As shown in FIG. 5, the voltage regulator module 2 includes four single-phase buck circuits. Each single-phase buck circuit includes a driver switching unit 21 (also referred as a switching circuit 21) and an inductor L. The switching circuit 21 includes a driver and a switch element. In other words, the voltage regulator module 2 includes four switching circuits 21 and four inductors L.

The second terminal of each switching circuit 21 and the first terminal SW of the corresponding inductor L are electrically connected with each other to define the corresponding single-phase buck circuit. The first terminals of the four single-phase buck circuits (e.g., the first terminals of the switching circuits 21) are connected with each other and electrically connected with the input capacitor Cin. The four single-phase buck circuits are connected with each other in parallel to define a four-phase buck circuit. The input side of the voltage regulator module 2 includes a positive input terminal Vin+ and a negative input terminal Vin−. The first terminal of the input capacitor Cin is electrically connected with the positive input terminal Vin+ of the voltage regulator module 2. The second terminal of the input capacitor Cin is electrically connected with the negative input terminal Vin− of the voltage regulator module 2. The second terminals of the four single-phase buck circuits (i.e., the second terminals of the inductors L) are connected with each other and electrically connected with the output capacitor Cout. The output side of the voltage regulator module 2 includes a positive output terminal Vo+ and a negative output terminal Vo−. The negative input terminal Vin− and the negative output terminal Vo− are electrically connected with each other. The first terminal of the output capacitor Cout is electrically connected with the positive output terminal Vo+ of the voltage regulator module 2. The second terminal of the output capacitor Cout is electrically connected with the negative output terminal Vo− of the voltage regulator module 2.

In an embodiment, each switching circuit 21 includes a switch and a driver for driving the switch. Moreover, the voltage regulator module 2 further includes a control circuit 22. After the control circuit 22 samples the output voltage of the voltage regulator module 2 and the output current of each single-phase buck circuit, the control circuit 22 generates four pulse width modulation signals PWM1, PWM2, PWM3 and PWM4. The phase difference between every two adjacent pulse width modulation signals is 90 degree. For example, the phase difference between the pulse width modulation signals PWM1 and PWM2 is 90 degree, the phase difference between the pulse width modulation signals PWM2 and PWM3 is 90 degree, the phase difference between the pulse width modulation signals PWM3 and PWM4 is 90 degree, and the phase difference between the pulse width modulation signals PWM4 and PWM1 is 90 degree. Every single-phase buck circuit is controlled by the control circuit 22 according to the corresponding pulse width modulation signal. For example, the first single-phase buck circuit is controlled according to the first pulse width modulation signal PWM1, the second single-phase buck circuit is controlled according to the second pulse width modulation signal PWM2, the third single-phase buck circuit is controlled according to the third pulse width modulation signal PWM3, and the fourth single-phase buck circuit is controlled according to the fourth pulse width modulation signal PWM4.

Structurally, the voltage regulator module 2 includes a first circuit board 3, at least one metallic winding assembly 4 and a magnetic core assembly 5. The first circuit board 3 includes a first surface 31, a second surface 32 and at least one accommodation space 33. For showing the position of the accommodation space 33, the first surface 31 and the second surface 32 as shown in FIGS. 2 and 3 are shown as two separate components. In fact, the first surface 31 and the second surface 32 of the first circuit board 3 are integrally formed. The first surface 31 and the second surface 32 are opposed to each other. Moreover, the first surface 31 of the first circuit board 3 includes at least one first opening 311, and the second surface 32 of the first circuit board 3 includes at least one second opening 321. As shown in FIG. 3, the first surface 31 of the first circuit board 3 includes four first openings 311, and the second surface 32 of the first circuit board 3 includes four second openings 321. The second openings 321 are aligned with the corresponding first openings 311, respectively. In this embodiment, the first circuit board 3 includes four accommodation spaces 33. The accommodation spaces 33 are disposed within the first circuit board 3 and arranged between the first surface 31 and the second surface 32. The accommodation spaces 33 are in communication with the corresponding first openings 311 and the corresponding second openings 321, respectively.

As shown in FIG. 3, the voltage regulator module 2 includes four metallic winding assemblies 4. The four metallic winding assemblies 4 are wound along the same direction. Each metallic winding assembly 4 is made of copper, aluminum, copper alloy, aluminum alloy or any other appropriate metallic material with high conductivity and low parasitic resistance. The metallic winding assemblies 4 are disposed within the corresponding accommodation spaces 33, respectively. That is, the metallic winding assemblies 4 are embedded in the first circuit board 3. Especially, the metallic winding assemblies 4 are arranged along a plane, which is parallel with the first surface 31 and the second surface 32 of the first circuit board 3. Moreover, each metallic winding assembly 4 includes a third opening 41. The position and shape of each third opening 41 match the positions and shapes of the corresponding second opening 321 and the corresponding first opening 311. For example, the third opening 41 is defined by an inner wall 44 of the corresponding metallic winding assembly 4.

The magnetic core assembly 5 includes an upper core 51, a lower core 52 and at least one lateral leg 53. The upper core 51 is disposed on the first circuit board 3 through the first surface 31 of the first circuit board 3. Preferably but not exclusively, the upper core 51 is located at a middle region of the first circuit board 3. The lower core 52 is disposed on the first circuit board 3 through the second surface 32 of the first circuit board 3. The upper core 51 and the lower core 52 are disposed on two opposite sides of the first circuit board 3 and aligned with each other. In this embodiment, the magnetic core assembly 5 includes four lateral legs 53, and the four lateral legs 53 are arranged between the upper core 51 and the lower core 52. In the embodiment as shown in FIG. 3, the four lateral legs 53 are connected with the lower core 52. Alternatively, the four lateral legs 53 are connected with the upper core 51, or the four lateral legs 53 are individually arranged between the upper core 51 and the lower core 52.

When the upper core 51 and the lower core 52 of the magnetic core assembly 5 are connected with each other, the lateral legs 53 are penetrated through the corresponding second openings 321, the corresponding third openings 41 and the corresponding first openings 311, respectively. Consequently, the first circuit board 3 is clamped between the upper core 51 and the lower core 52. In this embodiment, the metallic winding assemblies 4 are aligned with the corresponding lateral legs 53, respectively. Consequently, the magnetic core assembly 5 and the metallic winding assemblies 4 are collaboratively formed as four inductors L. Moreover, the directions of the DC magnetic fluxes flowing through the four lateral legs 53 are identical.

As mentioned above, the metallic winding assemblies 4 are embedded in the corresponding accommodation spaces 33 of the first circuit board 3, and the magnetic core assembly 5 is disposed on the first circuit board 3 in a vertical clamping manner. Moreover, one inductor L is defined by the magnetic core assembly 5 and the corresponding metallic winding assembly 4. In other words, a portion of the inductor L (i.e., the metallic winding assembly 4) is disposed within the first circuit board 3, and the other portion of the inductor L (i.e., the magnetic core assembly 5) is disposed on the first circuit board 3. As previously described, the magnetic element of the voltage regulator module is stacked on the circuit board of the electronic device according to the conventional technology. Since a portion of the voltage regulator module is embedded in the circuit board according to the technology of the present disclosure, the height of the voltage regulator module is largely reduced.

Moreover, the metallic winding assemblies 4 are disposed within the corresponding accommodation spaces 33 of the first circuit board 3. Consequently, the voltage regulator module 2 can meet the requirement of the multi-phase buck circuit. As mentioned above, the circuit board of the conventional voltage regulator module is a multilayered circuit board and a plurality of planar winding assemblies are mounted in the multilayered circuit board. Consequently, the voltage regulator module 2 of the present disclosure is much thinner than the conventional voltage regulator module. Since the metallic winding assembly 4 has lower parasitic resistance and lower power loss than the planar winding assembly, the overall parasitic resistance and the overall power loss of the voltage regulator module 2 are reduced when compared with the conventional voltage regulator module.

As mentioned above, the voltage regulator module 2 further includes at least one switching circuit 21 (e.g., four switching circuits). The four switching circuits 21 are disposed on the first surface 31 of the first circuit board 3. Two of the four switching circuits 21 are located beside a first side of the upper core 51 and arranged along the same direction. The other two of the four switching circuits 21 are located beside a second side of the upper core 51 and arranged along the same direction. The first side and the second side of the upper core 51 are opposed to each other. Consequently, the pins of the two switching circuits 21 located beside the first side of the upper core 51 are protruded along the same direction, and the pins of the two switching circuits 21 located beside the second side of the upper core 51 are protruded along the same direction.

The first circuit board 3 further includes at least one conductive hole (not shown). The conductive hole is a blind hole, e.g., a laser-drilled blind hole or a machine-drilled blind hole. The conductive hole is in communication with the first surface 31 of the first circuit board 3 and the corresponding metallic winding assembly 4. Each switching circuit 21 is electrically connected with the first terminal 42 of the corresponding metallic winding assembly 4 through the corresponding conductive hole.

In some other embodiments, the switching circuit 21 is embedded in the first circuit board 3 (not shown). The projection region of the switching circuit 21 on the first surface 31 of the first circuit board 3 and the projection region of the corresponding accommodation space 33 on the first surface 31 of the first circuit board 3 are partially overlapped with each other. In other words, the projection region of the switching circuit 21 on the first circuit board 3 and the projection region of the corresponding metallic winding assembly 4 on the first surface 31 of the first circuit board 3 are partially overlapped with each other. Preferably but not exclusively, the overlapped area is the minimum area of the conductive hole for resulting in the electric connection between the corresponding switching circuit 21 and the corresponding metallic winding assembly 4. Consequently, the conductive hole is connected with the corresponding switching circuit 21 and the corresponding metallic winding assembly 4 through the conductive hole along the shortest path.

The magnetic core assembly 5 further includes a middle post 54. The middle post 54 is penetrated through the first circuit board 3. For allowing the middle post 54 to be penetrated through the first circuit board 3, a first middle perforation is defined by the four metallic winding assemblies 4 according to the positions and shapes of the four metallic winding assemblies 4. Moreover, a second middle perforation is formed on the first surface 31 of the first circuit board 3, and a third middle perforation is formed on the second surface 32 of the first circuit board 3. The positions and shapes of the second middle perforation and the third middle perforation match the position and shape of the first middle perforation. After the middle post 54 is penetrated through the third middle perforation, the first middle perforation and the second middle perforation, the middle post 54 is arranged between the upper core 51 and the lower core 52 and the four lateral legs 53 are arranged around the middle post 54.

In some embodiments, a top end of the middle post 54 is connected with a middle region of the upper core 51, and an air gap is formed between a bottom end of the middle post 54 and the lower core 52.

In some other embodiments, the bottom end of the middle post 54 is connected with a middle region of the lower core 52, and an air gap is formed between the top end of the middle post 54 and the upper core 51.

In some other embodiments, the magnetic core assembly 5 omits middle post, and the first surface 31 and the second surface 32 of the first circuit board 3 omit the middle perforations, respectively. Under this circumstance, the middle regions of the first surface 31 and the second surface 32 are clearance regions for placing electronic components, planar winding assemblies or conductive traces. In one embodiment, no electronic components, planar winding assemblies or electric traces are located at the clearance region.

In this embodiment, the first circuit board 3 includes a plurality of lateral walls 36. The plurality of lateral walls 36 are arranged between the first surface 31 and the second surface 32 of the first circuit board 3 and arranged around the first surface 31 and the second surface 32 of the first circuit board 3. Moreover, the accommodation spaces 33 are enclosed by the plurality of lateral walls 36. In another embodiment, at least one accommodation spaces 33 is exposed to at least one lateral wall 36. Since the metallic winding assemblies 4 are disposed within the corresponding accommodation spaces 33, the metallic winding assembly 4 can be exposed to the corresponding lateral wall 36 through the corresponding accommodation space 33. Consequently, the size of the metallic winding assembly 4 to be embedded in the first circuit board 3 can be increased. In such way, the available space of the voltage regulator module 2 is enhanced, and the DC equivalent resistance of the metallic winding assembly 4 is reduced.

Moreover, since the DC magnetic fluxes of the middle post 54 are superposed and the AC magnetic fluxes are balanced out, the core loss is reduced. In some embodiments, the material of the middle post 54 is different from the material of the lateral post 53. For example, the middle post 54 is made of iron powder material with high saturation magnetic density. Consequently, the cross section area of the middle post 54 is reduced. In such way, the area of the metallic winding assembly 4 is increased, and the equivalent DC impedance and the power loss of the voltage regulator module 2 are reduced.

Please refer to FIG. 4 again. The voltage regulator module 2 further includes a first positive output contact pad 71, at least one first negative output contact pad 72, at least one first positive input contact pad 73 and a plurality of first signal contact pads 74. The first positive output contact pad 71, the at least one first negative output contact pad 72, the at least one first positive input contact pad 73 and the plurality of first signal contact pads 74 are disposed on the second surface 32 of the first circuit board 3. Consequently, the first positive output contact pad 71, the at least one first negative output contact pad 72, the at least one first positive input contact pad 73 and the plurality of first signal contact pads 74 are used as the positive output terminal Vo+, the negative output terminal Vo−, the positive input terminal Vin+ and the signal terminals of the voltage regulator module 2, respectively. Since the negative output terminal Vo− and the negative input terminal Vin− of the voltage regulator module 2 are directly connected with each other, the at least one first negative output contact pad 72 can also be used as the negative input terminal Vin−.

Preferably but not exclusively, the first positive output contact pad 71, the at least one first negative output contact pad 72, the at least one first positive input contact pad 73 and the plurality of first signal contact pads 74 have circular shapes, rectangular shapes, square shapes, oval shapes or hollow rectangular shapes. The first circuit board 3 further includes at least one conductive hole (not shown). The conductive hole is a blind hole, e.g., a laser-drilled blind hole or a machine-drilled blind hole. The conductive hole is in communication with the second surface 32 and the corresponding accommodation space 33 of the first circuit board 3. The at least one first positive input contact pad 73 is electrically connected with the second terminal 43 of the metallic winding assembly 4 through the corresponding conductive hole. Moreover, the heat generated by the metallic winding assembly 4 can be transferred to the second surface 32 of the first circuit board 3 through the conductive hole. The voltage regulator module 2 further includes at least one input capacitor 70. The at least one input capacitor 70 is disposed on the second surface 32 of the first circuit board 3 and arranged between the at least one first positive input contact pad 73 and the at least one first negative output contact pad 72. Moreover, the at least one input capacitor 70 is electrically connected with the at least one first positive input contact pad 73 and the at least one first negative output contact pad 72 through the traces of the first circuit board 3.

In the above embodiment, the voltage regulator module 2 is applied to the four single-phase buck circuits. It is noted that the applications of the voltage regulator module are not restricted and may be applied to two-phase buck circuit or multi-phase buck circuit.

Figure 6:
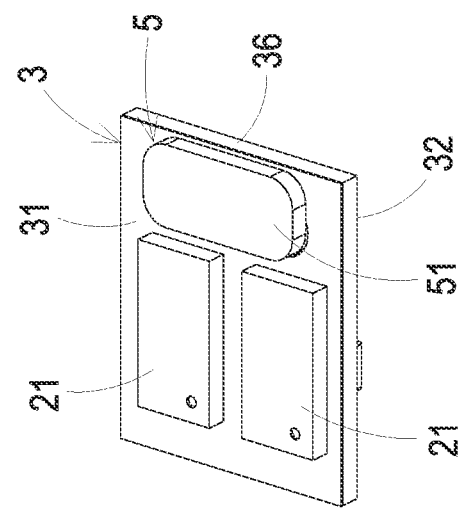
FIG. 6 is a schematic perspective view illustrating the structure of a voltage regulator module according to a second embodiment of the present disclosure.
Figure 7:
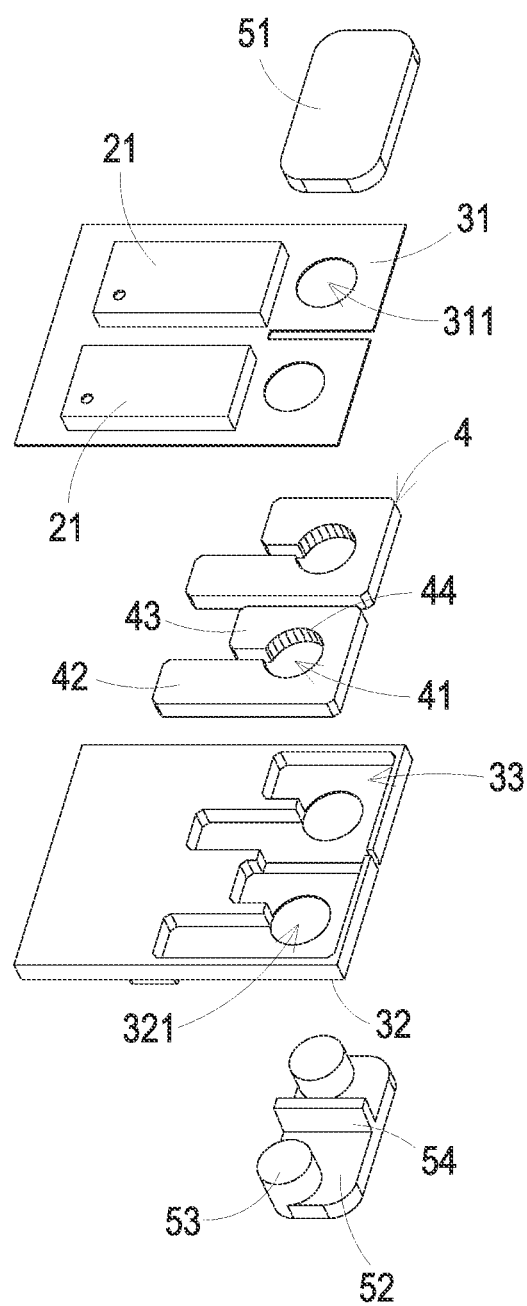
FIG. 7 is a schematic exploded view illustrating the structure of the voltage regulator module as shown in FIG. 6.

Please refer to FIGS. 6 and 7. FIG. 6 is a schematic perspective view illustrating the structure of a voltage regulator module according to a second embodiment of the present disclosure. FIG. 7 is a schematic exploded view illustrating the structure of the voltage regulator module as shown in FIG. 6. In comparison with the first embodiment, the voltage regulator module 2a includes two single-phase buck circuits. The voltage regulator module 2 of FIGS. 2 to 4 comprises four single-phase buck circuits. In this embodiment, voltage regulator module 2a comprises two-phase buck circuit.

Structurally, the voltage regulator module 2a includes a first circuit board 3, two metallic winding assemblies 4, a magnetic core assembly 5 and two switching circuits 21. The two metallic winding assemblies 4 are wound along the same direction. The magnetic core assembly 5 includes an upper core 51, a lower core 52, two lateral legs 53 and a middle leg 54. The two lateral legs 53 are arranged between the upper core 51 and the lower core 52. In the embodiment as shown in FIG. 7, the two lateral legs 53 are connected with two ends of the lower core 52, respectively. Alternatively, the two lateral legs 53 are connected with two ends of the upper core 51, respectively. Alternatively, the two lateral legs 53 are individually arranged between the upper core 51 and the lower core 52. Moreover, the middle leg 54 is arranged between the upper core 51 and the lower core 52, and arranged between the two lateral legs 53. In this embodiment, the metallic winding assemblies 4 are aligned with the corresponding lateral legs 53, respectively. Consequently, the magnetic core assembly 5 and the two metallic winding assemblies 4 are collaboratively formed as two inductors L. Moreover, the directions of the DC magnetic fluxes flowing through the two lateral legs 53 are identical.

In this embodiment, the two switching circuits 21 are disposed on the first surface 31 of the first circuit board 3. The two switching circuits 21 are located beside a first side of the upper core 51 and arranged along the same direction.

In some embodiments, the voltage regulator module is fixed on and electrically connected with a system board or a carrier board, and a plurality of conductive pads are disposed on the second surface of the first circuit board so as to be fixed on and connected with the system board or the carrier board. The plurality of conductive pads correspond to the plurality of contact pads in order to receive electric energy or signals from the plurality of contact pads or transmits the electric energy or signals to the system board or the carrier board.

Figure 8:
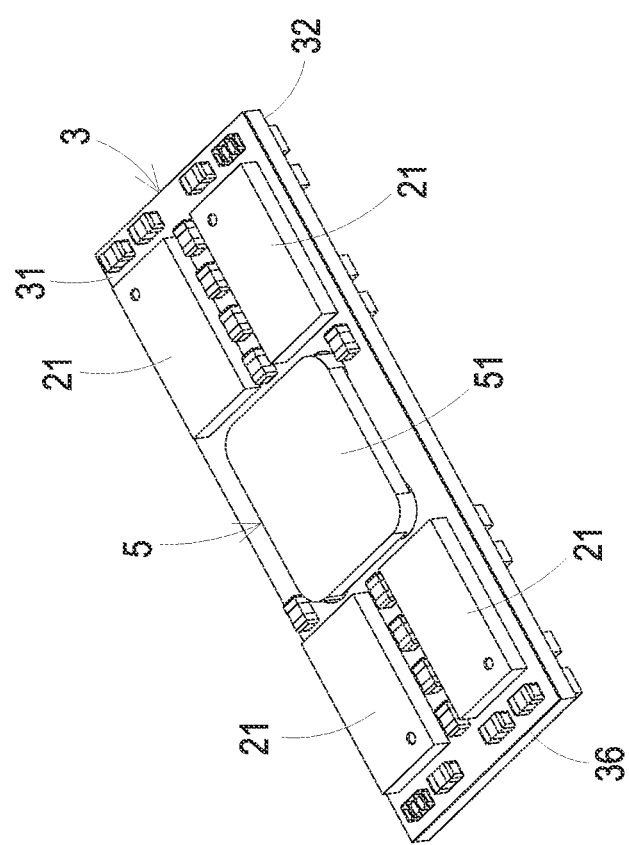
FIG. 8 is a schematic perspective view illustrating the structure of a voltage regulator module according to a third embodiment of the present disclosure.
Figure 9:
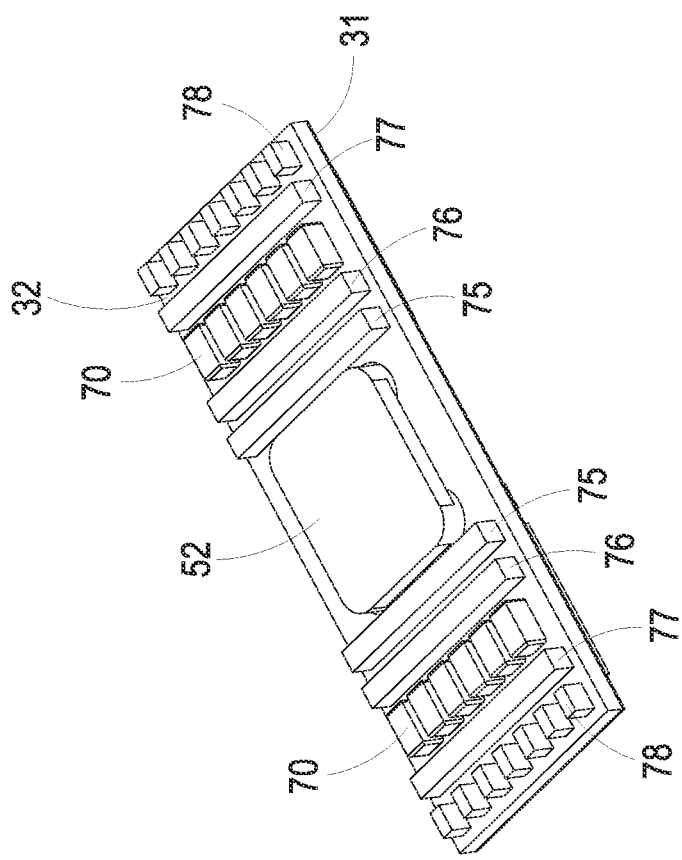
FIG. 9 is a schematic exploded view illustrating the structure of the voltage regulator module as shown in FIG. 8 and taken along another viewpoint.

Please refer to FIGS. 8 and 9. FIG. 8 is a schematic perspective view illustrating the structure of a voltage regulator module according to a third embodiment of the present disclosure. FIG. 9 is a schematic exploded view illustrating the structure of the voltage regulator module as shown in FIG. 8 and taken along another viewpoint. In comparison with the first embodiment, the voltage regulator module 2b of this embodiment further includes a plurality of conductive pads, which are metal bars or metal blocks. For example, the plurality of conductive pads include a positive output conductive pad 75, at least one negative output conductive pad 76, at least one positive input conductive pad 77 and a plurality of signal conductive pads 78. The positive output conductive pad 75, the at least one negative output conductive pad 76, the at least one positive input conductive pad 77 and the plurality of signal conductive pads 78 are disposed on the second surface 32 of the first circuit board 3. The conductive pads (i.e., the metal bars or the metal blocks) are made of copper, copper alloy or any other appropriate metallic material with high thermal conductivity and low thermal resistance. Preferably but not exclusively, the conductive pads (i.e., the metal bars or the metal blocks) have circular shapes, rectangular shapes, square shapes, oval shapes or hollow rectangular shapes.

The voltage regulator module 2b is electrically connected with the system board (not shown) through the plurality of conductive pads on the second surface 32 of the first circuit board 3 (e.g., the positive output conductive pad 75, the at least one negative output conductive pad 76, the at least one positive input conductive pad 77 and the plurality of signal conductive pads 78). The positive output conductive pad 75 is disposed on the first positive output contact pad 71. The electric energy received by the positive output terminal Vo+ is transmitted to the system board through the positive output conductive pad 75. The at least one negative output conductive pad 76 is disposed on the corresponding first negative output contact pad 72. The electric energy received by the negative output terminal Vo− is transmitted to the system board through the at least one negative output conductive pad 76. The at least one positive input conductive pad 77 is disposed on the corresponding at least one first positive input contact pad 73. The electric energy received by the positive input terminal Vin+ is transmitted to the system board through the at least one positive input conductive pad 77. The signal conductive pads 78 are disposed on the corresponding first signal contact pads 74. The signals received by the signal terminals are transmitted to the system board through the signal conductive pads 78.

In some embodiments, the plurality of conductive pads (e.g., the positive output conductive pad 75, the at least one negative output conductive pad 76, the at least one positive input conductive pad 77 and the plurality of signal conductive pads 78), the input capacitors 70 and the lower core 52 are coplanar. Consequently, the second surface 32 of the first circuit board 3 of the voltage regulator module 2b can be mounted on the system board more smoothly.

In some embodiments, the voltage regulator module is further encapsulated. Consequently, the problem of causing shift or detachment of the voltage regulator module will be overcome.

Figure 10:
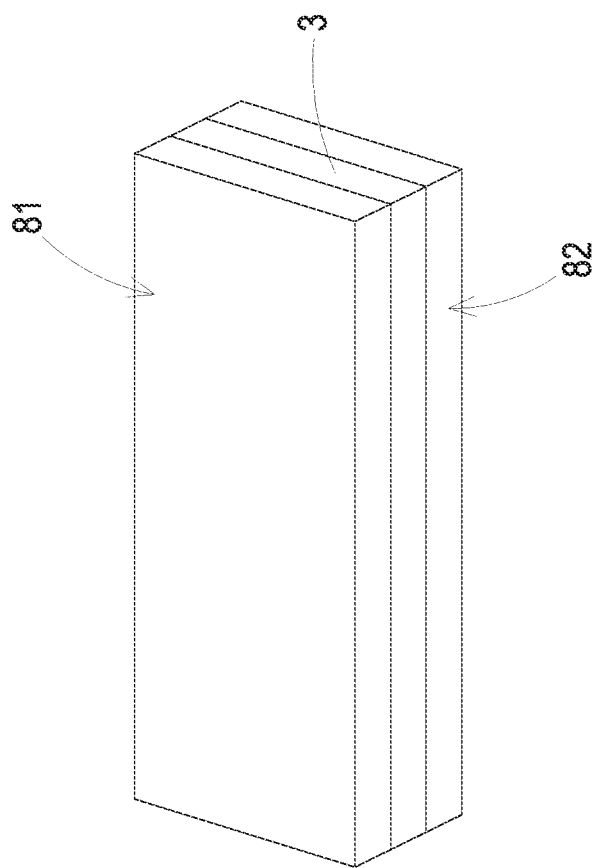
FIG. 10 is a schematic perspective view illustrating the structure of a voltage regulator module according to a fourth embodiment of the present disclosure.
Figure 11:
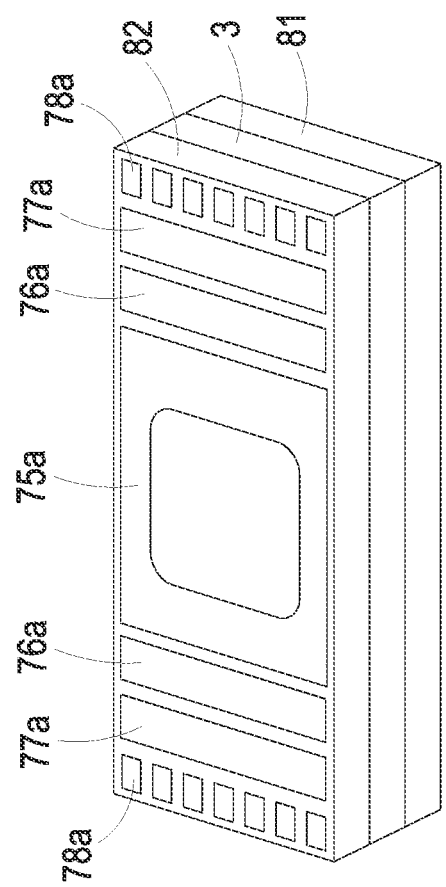
FIG. 11 is a schematic exploded view illustrating the structure of the voltage regulator module as shown in FIG. 10 and taken along another viewpoint.

Please refer to FIGS. 10 and 11. FIG. 10 is a schematic perspective view illustrating the structure of a voltage regulator module according to a fourth embodiment of the present disclosure. FIG. 11 is a schematic exploded view illustrating the structure of the voltage regulator module as shown in FIG. 10 and taken along another viewpoint. In comparison with the third embodiment, the voltage regulator module 2c further includes a first molding compound layer 81 and a second molding compound layer 82. The first molding compound layer 81 is disposed on the first surface 31 of the first circuit board 3. The switching circuits 21, the upper core 51 of the magnetic core assembly 5 and electronic components on the first surface 31 of the first circuit board 3 (see FIG. 8) are encapsulated by the first molding compound layer 81. The second molding compound layer 82 is disposed on the second surface 32 of the first circuit board 3. The input capacitors 70, the positive output conductive pad 75, the at least one negative output conductive pad 76, the at least one positive input conductive pad 77, the plurality of signal conductive pads 78 and electronic components on the second surface 32 of the first circuit board 3 (see FIG. 9) are encapsulated by the second molding compound layer 82. It is noted that numerous modifications and alterations may be made while retaining the teachings of the disclosure. In another embodiment, the voltage regulator module includes one of the first molding compound layer 81 and the second molding compound layer 82.

Moreover, after the input capacitors 70, the positive output conductive pad 75, the at least one negative output conductive pad 76, the at least one positive input conductive pad 77, the plurality of signal conductive pads 78 and electronic components on the second surface 32 of the first circuit board 3 are encapsulated by the second molding compound layer 82, the second molding compound layer 82 is polished. Consequently, a surface of the positive output conductive pad 75, a surface of the negative output conductive pad 76, a surface of the positive input conductive pad 77 and a surface of the signal conductive pad 78 are exposed to the surface of the second molding compound layer 82. Moreover, a plurality of electroplated patterns are formed on the surface of the second molding compound layer 82 by an electroplating process. The plurality of electroplated patterns are aligned with the corresponding conductive pads that are exposed to the surface of the second molding compound layer 82. For example, a first electroplated pattern 75*a* is formed on the exposed surface of the positive output conductive pad 75 and used as the positive output terminal Vo+ of the voltage regulator module 2*c*, a second electroplated pattern 76*a* is formed on the exposed surface of the negative output conductive pad 76 and used as the negative output terminal Vo– of the voltage regulator module 2*c*, a third electroplated pattern 77*a* is formed on the exposed surface of the positive input conductive pad 77 and used as the positive input terminal Vin+ of the voltage regulator module 2*c*, and a fourth electroplated pattern 78*a* is formed on the exposed surface of each signal contact pad 78 and used as the signal terminal of the voltage regulator module 2*c*.

It is noted that the number of the electroplated patterns and the positions of the electroplated patterns are not restricted. That is, the number of the electroplated patterns and the positions of the electroplated patterns may be varied according to the practical requirements. As the area of the electroplated pattern is increased, the weldable area of the voltage regulator module 2*c* is increased. Consequently, when the voltage regulator module on the system board undergoes a reflow soldering process, the inner components of the voltage regulator module 2*c* to be reheated are not detached or shifted. In other words, the current density of the solder joint is largely reduced, and the reliability of the product is largely enhanced.

For mounting the first circuit board of the voltage regulator module on the system board more smoothly, the voltage regulator module may be modified. For example, a plurality of concave structures are formed on the first circuit board for receiving the input capacitors and the magnetic core assembly. Consequently, the contact pads, the input capacitors and the magnetic core assembly are coplanar. Under this circumstance, it is not necessary to form the conductive pads corresponding to the contact pads.

Figure 12:
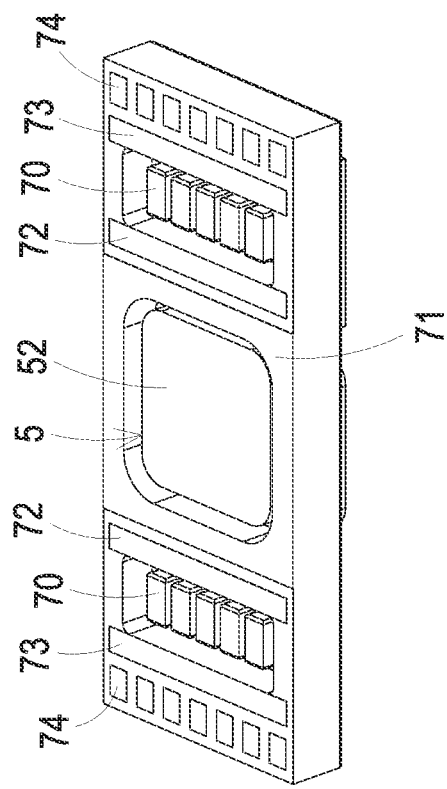
FIG. 12 is a schematic perspective view illustrating the structure of a voltage regulator module according to a fifth embodiment of the present disclosure.
Figure 13:
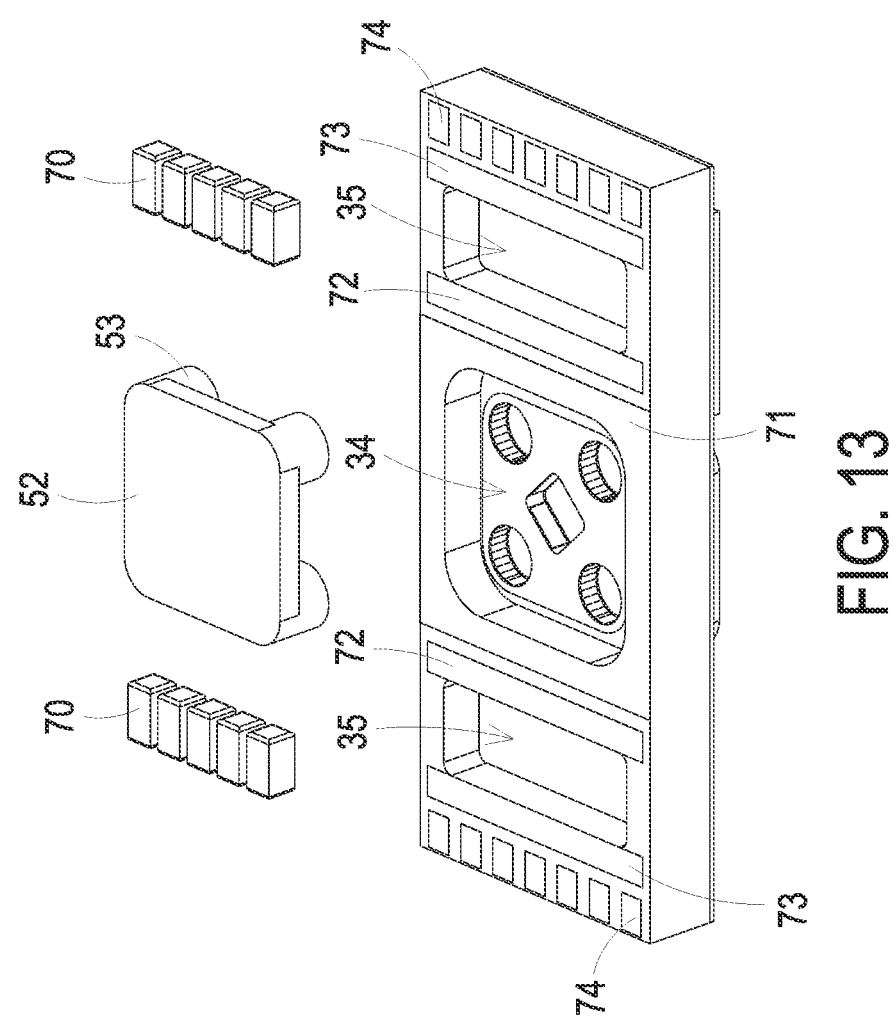
FIG. 13 is a schematic exploded view illustrating the structure of the voltage regulator module as shown in FIG. 12.

Please refer to FIGS. 12 and 13. FIG. 12 is a schematic perspective view illustrating the structure of a voltage regulator module according to a fifth embodiment of the present disclosure. FIG. 13 is a schematic exploded view illustrating the structure of the voltage regulator module as shown in FIG. 12. In comparison with the first embodiment, the first circuit board 3 of the voltage regulator module 2*d* of this embodiment further includes a first concave structure 34 and at least one second concave structure 35. The first concave structure 34 is concavely formed on the second surface 32 of the first circuit board 3. Particularly, the first concave structure 34 is a concave structure on the second surface 32 of the first circuit board 3. The first concave structure 34 is in communication with the second openings 321. The first concave structure 34 is separated from the accommodation spaces 33. Moreover, the first concave structure 34 and the accommodation spaces 33 are located at different levels with respect to the first circuit board 3. The lower core 52 of the magnetic core assembly 5 is disposed within the first concave structure 34. Moreover, the depth of the first concave structure 34 is greater than or equal to the thickness of the lower core 52 of the magnetic core assembly 5. Consequently, the lower core 52 is coplanar with the second surface 32 of the first circuit board 3, or the lower core 52 is not protruded over the second surface 32 of the first circuit board 3. Under this circumstance, the contact pads on the second surface 32 of the first circuit board 3 (i.e., the first positive output contact pad 71, the at least one first negative output contact pad 72, the at least one first positive input contact pad 73 and the plurality of first signal contact pads 74) can be in close contact with the system board. The at least one second concave structure 35 is located beside the first concave structure 34 and concavely formed on the second surface 32 of the first circuit board 3. In this embodiment, the first circuit board 3 includes two second concave structures 35 located beside two opposite sides of the first concave structure 34. The at least one second concave structure 35 is separated from the accommodation spaces 33. Moreover, the at least one second concave structure 35 and the accommodation spaces 33 are located at different levels with respect to the first circuit board 3. The at least one input capacitor 70 is disposed within the corresponding second concave structure 35. Moreover, the depth of the second concave structure 35 is greater than or equal to the thickness of the input capacitor 70. Consequently, the input capacitor 70 is coplanar with the second surface 32 of the first circuit board 3, or the input capacitor 70 is not protruded over the second surface 32 of the first circuit board 3. Under this circumstance, the contact pads on the second surface 32 of the first circuit board 3 can be in close contact with the system board. It is noted that numerous modifications and alterations may be made while retaining the teachings of the disclosure. In another embodiment, the voltage regulator module includes either first concave structure 34 or the second concave structure 35.

For mounting the first circuit board of the voltage regulator module on the system board more smoothly, the voltage regulator module further includes a second circuit board. The second circuit board is fixed on and electrically connected with the system board.

Figure 14:
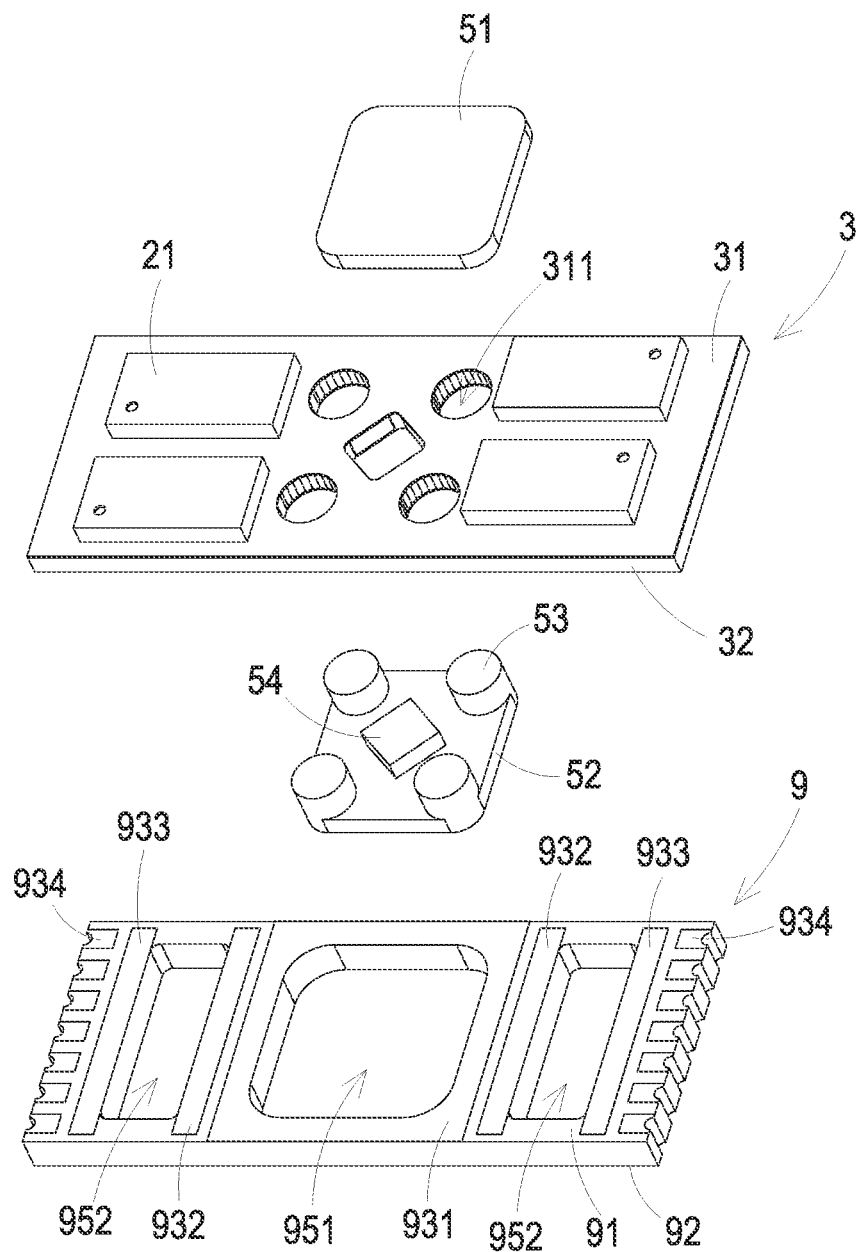
FIG. 14 is a schematic exploded view illustrating the structure of a voltage regulator module according to a sixth embodiment of the present disclosure.
Figure 15:
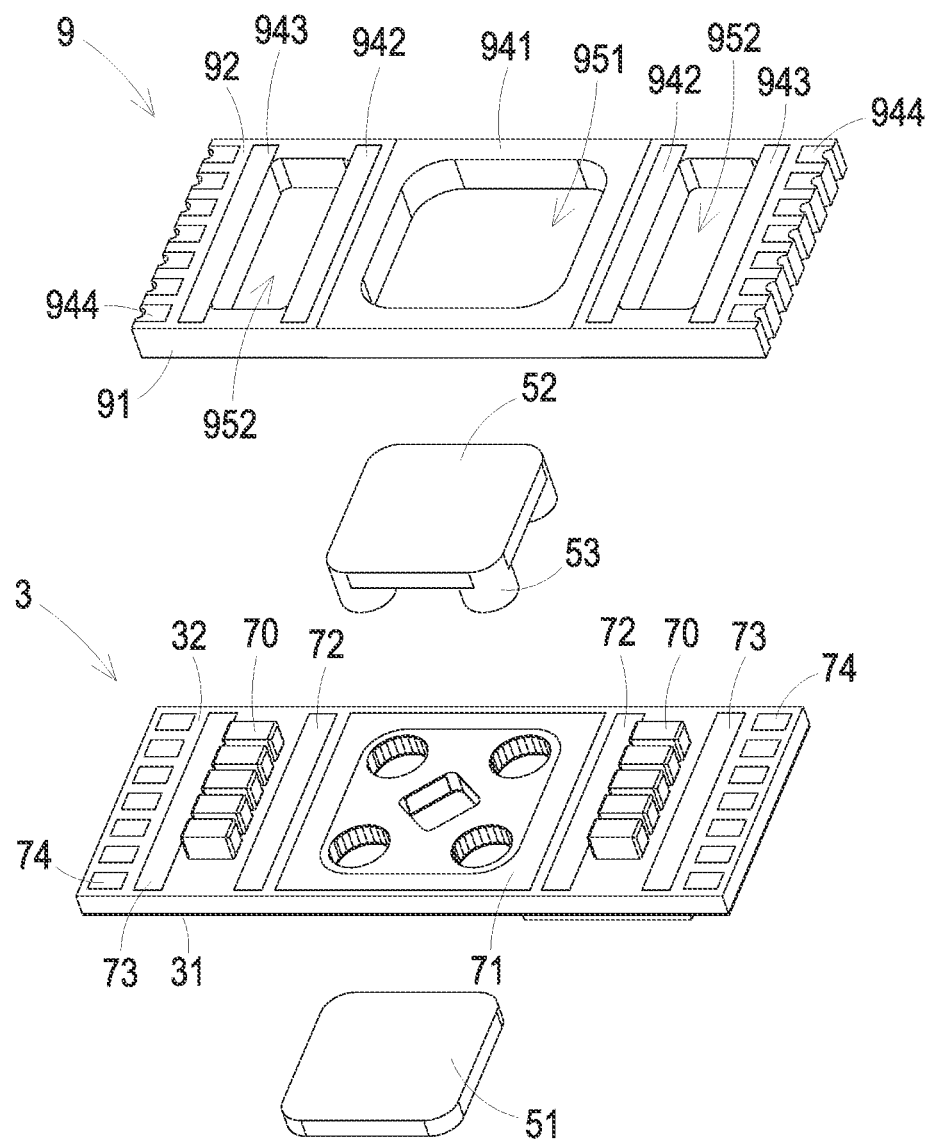
FIG. 15 is a schematic exploded view illustrating the structure of the voltage regulator module as shown in FIG. 14 and taken along another viewpoint.

Please refer to FIGS. 14 and 15. FIG. 14 is a schematic exploded view illustrating the structure of a voltage regulator module according to a sixth embodiment of the present disclosure. FIG. 15 is a schematic exploded view illustrating the structure of the voltage regulator module as shown in FIG. 14 and taken along another viewpoint. In this embodiment, the voltage regulator module 2*e* includes a first circuit board 3, at least one metallic winding assembly (not shown), a magnetic core assembly 5 and a second circuit board 9. In comparison with the first embodiment, the voltage regulator module 2*e* further includes the second circuit board 9. Component parts and elements corresponding to those of the first embodiment are designated by identical numeral references, and detailed descriptions thereof are omitted. The second circuit board 9 includes a first surface 91 and a second surface 92, which are opposed to each other. The first surface 91 of the second circuit board 9 is located beside and in contact with the second surface 32 of the first circuit board 3. The second circuit board 9 is connected with the system board through the second surface 92. The area of the second circuit board 9 is less than or equal to the area of the first circuit board 3. When the second circuit board 9 is fixed on the first circuit board 3, the edge electroplated regions of the second circuit board 9 can provide the lateral wetting capability. Consequently, the strength of fixing the second circuit board 9 on the first circuit board 3 is increased, the complexity of fixing the second circuit board 9 on the first circuit board 3 is reduced.

The second circuit board 9 further includes a first receiving recess 951 and two second receiving recesses 952. The first receiving recess 951 runs through the second circuit board 9. When the second circuit board 9 is in contact with the first circuit board 3, the lower core 52 of the magnetic core assembly 5 is accommodated within the first receiving recess 951. The horizontal size of the first receiving recess 951 is greater than or equal to the horizontal size of the lower core 52. The two second receiving recesses 952 run through the second circuit board 9. The two second receiving recesses 952 are located beside two opposite sides of the first receiving recess 951. When the second circuit board 9 is in contact with the first circuit board 3, the input capacitors 70 are accommodated within the corresponding second receiving recesses 952. The horizontal size of the second receiving recess 952 is greater than or equal to the overall size of the input capacitors 70 within the second receiving recesses 952.

In some embodiments, some other electronic components (e.g., capacitors, resistors, power components, chips, magnetic elements or mechanical components) are accommodated within the first receiving recess 951 and the second receiving recesses 952.

The voltage regulator module 2e further includes a second positive output contact pad 931, at least one second negative output contact pad 932, at least one second positive input contact pad 933 and a plurality of second signal contact pads 934. The second positive output contact pad 931, the at least one second negative output contact pad 932, the at least one second positive input contact pad 933 and the plurality of second signal contact pads 934 are disposed on the first surface 91 of the second circuit board 9. The second positive output contact pad 931 and the first positive output contact pad 71 are aligned with and in connect with each other. The second negative output contact pad 932 and the corresponding first negative output contact pad 72 are aligned with and in connect with each other. The second positive input contact pad 933 and the corresponding first positive input contact pad 73 are aligned with and in connect with each other. The second signal contact pads 934 and the corresponding first signal contact pads 74 are aligned with and in connect with each other. Consequently, the second circuit board 9 and the first circuit board 3 are combined together. The corresponding contact pads are connected with each other by a welding process or through a conductive adhesive. Preferably but not exclusively, the contact pads have circular shapes, rectangular shapes, square shapes, oval shapes or hollow rectangular shapes.

The voltage regulator module 2e further includes a positive output conductive pad 941, at least one negative output conductive pad 942, at least one positive input conductive pad 943 and a plurality of signal conductive pads 944. The positive output conductive pad 941, the at least one negative output conductive pad 942, the at least one positive input conductive pad 943 and the plurality of signal conductive pads 944 are disposed on the second surface 92 of the second circuit board 9. The positive output conductive pad 941 is electrically connected with the second positive output contact pad 931 through a conductive hole of the second circuit board 9. The at least one negative output conductive pad 942 is electrically connected with the corresponding second negative output contact pad 932 through the corresponding conductive hole of the second circuit board 9. The at least one positive input conductive pad 943 is electrically connected with the corresponding second positive input contact pad 933 through the corresponding conductive hole of the second circuit board 9. Each signal conductive pad 944 is electrically connected with the corresponding second signal contact pad 934 through the corresponding conductive hole of the second circuit board 9.

Moreover, the voltage regulator module 2e is fixed on and electrically connected with the system board through the conductive pads on the second surface 92 of the second circuit board 9 (i.e., the positive output conductive pad 941, the at least one negative output conductive pad 942, the at least one positive input conductive pad 943 and the plurality of signal conductive pads 944). The conductive pads on the second circuit board 9 are electrically connected with the corresponding contact pads through the corresponding conductive holes of the second circuit board 9.

Moreover, a plurality of edge electroplated regions are formed on the lateral wall of the second circuit board 9, the inner wall of the first receiving recess 951 or the inner wall of the second receiving recesses 952 by an electroplating process. The edge electroplated regions are electrically connected with the plurality of contact pads on the first surface 91 of the second circuit board 9 and the plurality of conductive pads on the second surface 92 of the second circuit board 9. When the second circuit board 9 and the first circuit board 3 are combined together by a welding process, the edge electroplated regions of the second circuit board 9 can provide the lateral wetting capability. Consequently, the second circuit board 9 can be securely fixed on the first circuit board 3. Similarly, when the second surface 92 of the second circuit board 9 is fixed on the system board by a welding process, the edge electroplated regions of the second circuit board 9 can provide the lateral wetting capability. Consequently, the second circuit board 9 can be securely fixed on the system board. According to this design, the voltage regulator module 2e can be mounted on the system board more smoothly through the second circuit board 9 and the fabricating process of the voltage regulator module 2e is simplified.

Figure 16:
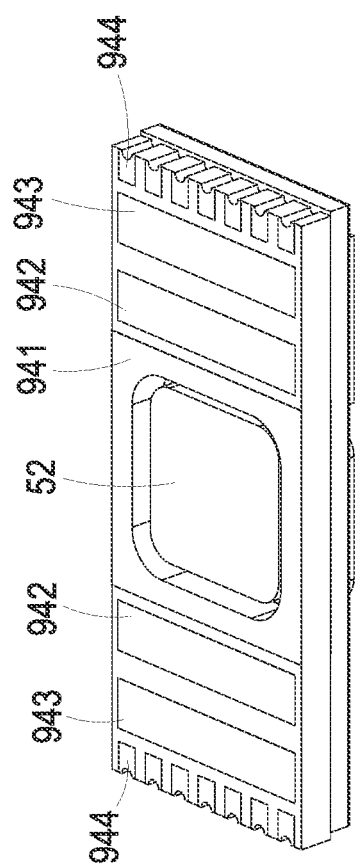
FIG. 16 is a schematic exploded view illustrating the structure of a voltage regulator module according to a seventh embodiment of the present disclosure.
Figure 17:
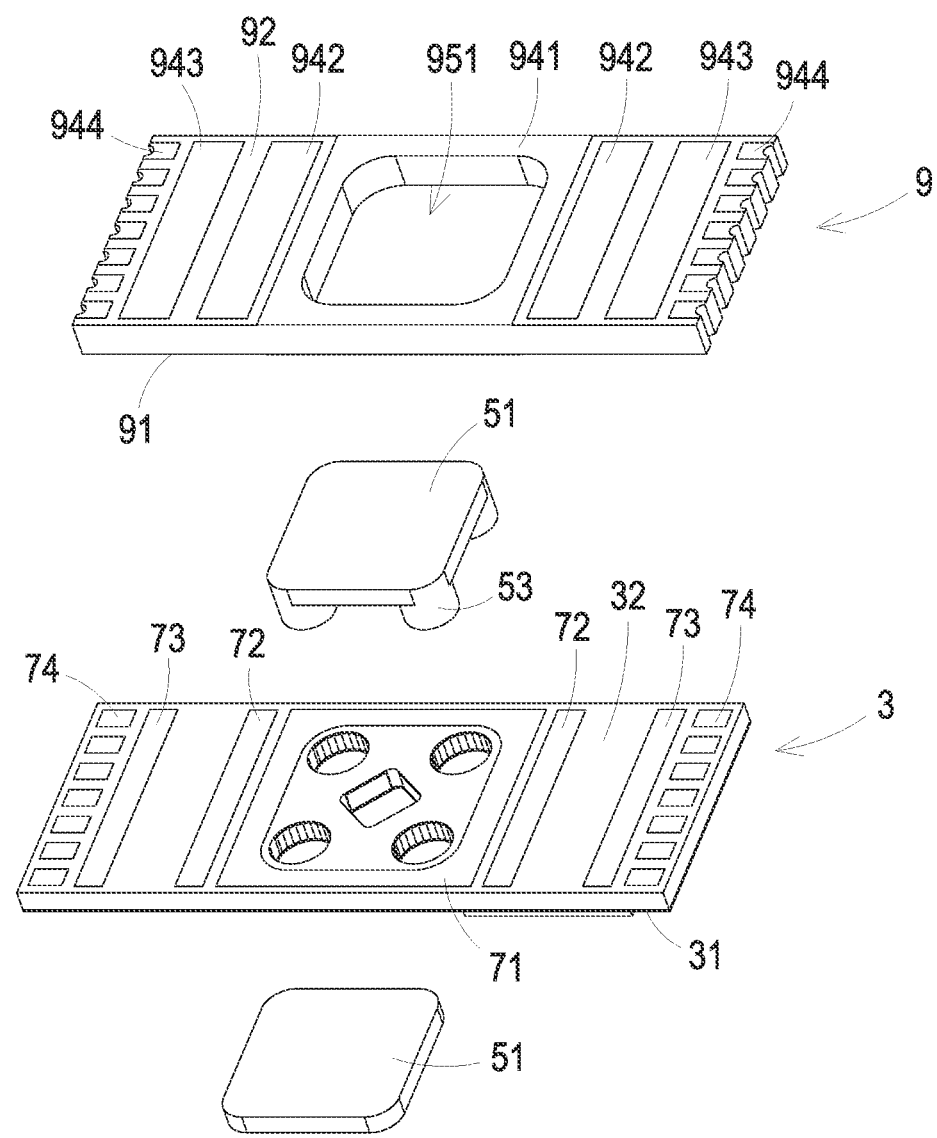
FIG. 17 is a schematic exploded view illustrating the structure of the voltage regulator module as shown in FIG. 16 and taken along another viewpoint.

Please refer to FIGS. 16 and 17. FIG. 16 is a schematic exploded view illustrating the structure of a voltage regulator module according to a seventh embodiment of the present disclosure. FIG. 17 is a schematic exploded view illustrating the structure of the voltage regulator module as shown in FIG. 16 and taken along another viewpoint. In comparison with the sixth embodiment, the input capacitors of the voltage regulator module 2f are embedded in the second circuit board 9. Moreover, the input capacitors are electrically connected with the first surface 91 and the second surface 92 of the second circuit board 9 through the corresponding conductive holes of the second circuit board 9. Moreover, the second circuit board 9 of the voltage regulator module 2f omits the second receiving recess. Since the input capacitors of the voltage regulator module 2f are embedded in the second circuit board 9, the conductive pads on the second surface 92 of the second circuit board 9 (e.g., the positive output conductive pad 941, the at least one negative output conductive pad 942, the at least one positive input conductive pad 943 and the plurality of signal conductive pads 944) may have increased areas. Consequently, the voltage regulator module 2f can be mounted on the system board more smoothly, and the fabricating process of the voltage regulator module 2f can be simplified. Moreover, since the input capacitors of the voltage regulator module 2f are embedded in the second circuit board 9, the areas of some contact parts on the first surface 91 of the second circuit board 9 can be increased. Consequently, the contact area between the first circuit board 3 and the second circuit board 9 is increased.

In the above embodiment, the second circuit board 9 is applied to the four single-phase buck circuits. In some other embodiments, the second circuit board 9 is applied to two-phase buck circuit or multi-phase buck circuit. The locations of the first receiving recess, the second receiving recess, the plurality of conductive pads and the plurality of contact pads may be determined according to the location of the magnetic core assembly. The methods of installing these components are similar to those of the above embodiments, and are not redundantly described herein.

From the above descriptions, the present disclosure provides the voltage regulator module. The metallic winding assemblies are embedded in the corresponding accommodation spaces of the first circuit board, and the magnetic core assembly is disposed on the first circuit board in a vertical clamping manner. Moreover, one inductor is defined by the magnetic core assembly and the corresponding metallic winding assembly. In other words, a portion of the inductor (i.e., the metallic winding assembly) is disposed within the first circuit board, and the other portion of the inductor (i.e., the magnetic core assembly) is disposed on the first circuit board. As previously described, the magnetic element of the voltage regulator module is stacked on the circuit board of the electronic device according to the conventional technology. Since a portion of the voltage regulator module is embedded in the circuit board according to the technology of the present disclosure, the height of the voltage regulator module is largely reduced.

Moreover, the metallic winding assemblies are disposed within the corresponding accommodation spaces of the first circuit board. Consequently, the voltage regulator module can meet the requirement of the multi-phase buck circuit. As mentioned above, the circuit board of the conventional voltage regulator module is a multilayered circuit board and a plurality of planar winding assemblies are mounted in the multilayered circuit board. Consequently, the voltage regulator module of the present disclosure is much thinner than the conventional voltage regulator module. Since the metallic winding assembly has lower parasitic resistance and lower power loss than the planar winding assembly, the overall parasitic resistance and the overall power loss of the voltage regulator module are reduced when compared with the conventional voltage regulator module.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module, comprising:
   a first circuit board comprising at least one accommodation space, a first surface and a second surface, wherein the first surface and the second surface of the first circuit board are opposed to each other, the first surface of the first circuit board comprises at least one first opening, the second surface of the first circuit board comprises at least one second opening, the at least one accommodation space is formed within the first circuit board and arranged between the first surface and the second surface of the first circuit board, and the at least one accommodation space is in communication with the at least one first opening and the at least one second opening;
   at least one metallic winding assembly disposed within the at least one accommodation space and embedded in the first circuit board, wherein the at least one metallic winding assembly comprises at least one third opening, the at least one third opening is aligned with the corresponding first opening and the corresponding second opening;
   at least one switching circuit disposed on the first surface of the first circuit board, wherein a projection region of the at least one switching circuit on the first surface of the first circuit board and a projection region of the corresponding metallic winding assembly on the first surface of the first circuit board are partially overlapped with each other; and
   a magnetic core assembly comprising an upper core, a lower core and at least one lateral leg, wherein the upper core is disposed on the first circuit board through the first surface of the first circuit board, the lower core is disposed on the first circuit board through the second surface of the first circuit board, the at least one lateral leg is arranged between the upper core and the lower core and penetrated through the corresponding first opening, the corresponding third opening and the corresponding second opening, and at least one inductor is defined by the magnetic core assembly and the at least one metallic winding assembly collaboratively;
   wherein one end of the at least one metallic winding assembly is electrically connected with the at least one switching circuit.

2. The voltage regulator module according to claim 1, wherein the first circuit board comprises a first concave structure, the first concave structure is concavely formed on the second surface of the first circuit board, and the lower core of the magnetic core assembly is disposed within the first concave structure, wherein the first concave structure is separated from the at least one accommodation space, and the first concave structure and the at least one accommodation space are located at different levels with respect to the first circuit board.

3. The voltage regulator module according to claim 2, wherein a depth of the first concave structure is greater than or equal to a thickness of the lower core of the magnetic core assembly.

4. The voltage regulator module according to claim 1, wherein the second surface of the first circuit board comprises a first positive output contact pad, a first negative output contact pad, a first positive input contact pad and a plurality of first signal contact pads, the first circuit board further comprises at least one conductive hole, the conductive hole is in communication with the second surface and the at least one accommodation space of the first circuit board, the first positive input contact pad is electrically connected with a second terminal of the metallic winding assembly through the at least one conductive hole.

5. The voltage regulator module according to claim 4, wherein the first circuit board comprises a positive output conductive pad, a negative output conductive pad, a positive input conductive pad and a plurality of signal conductive pads, the positive output conductive pad is disposed on the first positive output contact pad, the negative output conductive pad is disposed on the first negative output contact pad, the positive input conductive pad is disposed on the first positive input contact pad, and each of the plurality of signal conductive pads is disposed on the corresponding first signal contact pad.

6. The voltage regulator module according to claim 4, further comprising a first molding compound layer, wherein the first molding compound layer is disposed on the first surface of the first circuit board, and the upper core of the magnetic core assembly and the at least one switching circuit are encapsulated by the first molding compound layer.

7. The voltage regulator module according to claim 5, further comprising a second molding compound layer, wherein the second molding compound layer is disposed on the second surface of the first circuit board, wherein the positive output conductive pad, the negative output conductive pad, the positive input conductive pad and the plurality of signal conductive pads are encapsulated by the second molding compound layer, wherein a surface of the positive output conductive pad, a surface of the negative output conductive pad, a surface of the positive input conductive pad and a surface of each of the plurality of signal conductive pads are exposed to a surface of the second molding compound layer.

8. The voltage regulator module according to claim 4, further comprising at least one input capacitor, wherein the at least one input capacitor is disposed on the second surface of the first circuit board and located between the first positive input contact pad and the first negative output contact pad.

9. The voltage regulator module according to claim 4, further comprising at least one input capacitor, wherein the first circuit board comprises at least one second concave structure, the at least one second concave structure is concavely formed on the second surface of the first circuit board, and the at least one input capacitor is disposed within the corresponding second concave structure, wherein the at least one second concave structure is separated from the at least one accommodation space, and the at least one second concave structure and the at least one accommodation space are located at different levels with respect to the first circuit board.

10. The voltage regulator module according to claim 9, wherein a depth of the at least one second concave structure is greater than or equal to a thickness of the at least one input capacitor.

11. The voltage regulator module according to claim 4, further comprising a second circuit board, wherein the second circuit board comprises a first surface and a second surface, and the first surface and the second surface of the second circuit board are opposed to each other, wherein the first surface of the second circuit board is located beside and in contact with the second surface of the first circuit board.

12. The voltage regulator module according to claim 11, wherein the second circuit board further comprises a first receiving recess, wherein the first receiving recess runs through the second circuit board, and the lower core of the magnetic core assembly is accommodated within the first receiving recess.

13. The voltage regulator module according to claim 11, further comprising at least one input capacitor, wherein the at least one input capacitor is disposed on the second surface of the first circuit board, wherein the second circuit board further comprises at least one second receiving recess, wherein the at least one second receiving recess runs through the second circuit board, and the at least one input capacitor is accommodated within the at least one second receiving recess.

14. The voltage regulator module according to claim 11, wherein the first surface of the second circuit board comprises a second positive output contact pad, a second negative output contact pad, a second positive input contact pad and a plurality of second signal contact pads, wherein the second positive output contact pad and the first positive output contact pad are fixed on and connected with each other, the second negative output contact pad and the first negative output contact pad are fixed on and connected with each other, the second positive input contact pad and the first positive input contact pad are fixed on and connected with each other, and each of the plurality of second signal contact pads and the corresponding first signal contact pad are fixed on and connected with each other.

15. The voltage regulator module according to claim 14, wherein the second surface of the second circuit board comprises a positive output conductive pad, a negative output conductive pad, a positive input conductive pad and a plurality of signal conductive pads, wherein the positive output conductive pad, the negative output conductive pad, the positive input conductive pad and each of the plurality of signal conductive pads are respectively connected with the second positive output contact pad, the second negative output contact pad, the second positive input contact pad and the corresponding second signal contact pad through corresponding conductive holes of the second circuit board.

16. The voltage regulator module according to claim 11, further comprising at least one input capacitor, wherein the at least one input capacitor is embedded in the second circuit board.

17. The voltage regulator module according to claim 11, wherein an area of the second circuit board is less than or equal to an area of the first circuit board.

18. The voltage regulator module according to claim 1, wherein the first circuit board further comprises at least one additional conductive hole, wherein the at least one additional conductive hole is in communication with the first surface of the first circuit board and the metallic winding assembly, and the at least one switching circuit is electrically connected with a first terminal of the metallic winding assembly through the corresponding additional conductive hole.

19. The voltage regulator module according to claim 1, wherein the upper core has a first side and a second side opposed to each other, and the at least one switching circuit comprises a plurality of switching circuits, wherein portions of the plurality of switching circuits are located beside the first side of the upper core and arranged along the same direction, and the other portions of the plurality of switching circuits are located beside the second side of the upper core and arranged along the same direction.

20. The voltage regulator module according to claim 1, wherein the at least one switching circuit comprises a plurality of switching circuits, and the plurality of switching circuits are located beside the upper core and arranged along the same direction.

21. The voltage regulator module according to claim 1, wherein the magnetic core assembly comprises a middle post, the middle post and the at least one lateral leg are located between the upper core and the lower core, wherein a top end of the middle post is connected with the upper core, and an air gap is formed between a bottom end of the middle post and the lower core, or the bottom end of the middle post is connected with the lower core, and an air gap is formed between the top end of the middle post and the upper core.

22. The voltage regulator module according to claim 1, wherein the at least one metallic winding assembly comprises the plurality of metallic winding assemblies, the plurality of metallic winding assemblies are wound along the same direction, the at least one lateral leg comprises a plurality of lateral legs, each of the plurality of metallic winding assemblies is disposed around the corresponding lateral leg, wherein each of the plurality of lateral legs is penetrated through the corresponding first opening, the corresponding third opening and the corresponding second opening, and a plurality of inductors are defined by the magnetic core assembly and the plurality of metallic winding assemblies collaboratively, the at least one accommodation space of the first circuit board comprises a plurality of accommodation spaces, each of the plurality of metallic winding assemblies is disposed in the corresponding accommodation space.

23. The voltage regulator module according to claim 22, wherein the plurality of metallic winding assemblies are arranged along a plane, which is parallel with the first surface and the second surface of the first circuit board.

* * * * *